(12) United States Patent
Yan et al.

(10) Patent No.: US 9,041,280 B2
(45) Date of Patent: May 26, 2015

(54) DOUBLE-SIDE LIGHT EMITTING DISPLAY PANEL

(71) Applicant: Industrial Technology Research Institute, Hsinchu (TW)

(72) Inventors: Jing-Yi Yan, Hsinchu County (TW); Chih-Chieh Hsu, Hsinchu County (TW); Chen-Wei Lin, Kaohsiung (TW); Shu-Tang Yeh, Taichung (TW); Ping-I Shih, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/753,449

(22) Filed: Jan. 29, 2013

(65) Prior Publication Data

US 2013/0193843 A1 Aug. 1, 2013

(30) Foreign Application Priority Data

Jan. 30, 2012 (TW) .............................. 101102899 A

(51) Int. Cl.
*H01J 1/62* (2006.01)
*H01J 63/04* (2006.01)
*H05B 33/22* (2006.01)
*H01L 51/52* (2006.01)
*H01L 27/32* (2006.01)

(52) U.S. Cl.
CPC ............ *H05B 33/22* (2013.01); *H01L 51/5218* (2013.01); *H01L 51/5234* (2013.01); *H01L 27/3211* (2013.01); *H01L 27/322* (2013.01); *H01L 27/3267* (2013.01)

(58) Field of Classification Search
CPC   H05B 33/22; H01L 27/3267; H01L 51/5218; H01L 27/3211; H01L 27/322; H01L 51/5234
USPC ............ 313/504; 349/114, 115, 113, 42, 106; 359/228, 245, 253
See application file for complete search history.

(56) References Cited

U.S. PATENT DOCUMENTS 7,507,993 B2   3/2009   Lee et al.
7,710,030 B2   5/2010   Lee
(Continued)

FOREIGN PATENT DOCUMENTS

CN   102104057   6/2011
EP    1434263   6/2004
(Continued)

OTHER PUBLICATIONS

Qingjin Qi, et al, "Enhancement of performance for blue organic light emitting devices based on double emission layers", Organic Electronics, vol. 11, 2010, pp. 503-507.
(Continued)

*Primary Examiner* — Anh Mai
*Assistant Examiner* — Glenn Zimmerman
(74) *Attorney, Agent, or Firm* — Jianq Chyun IP Office

(57) ABSTRACT

A double-side light emitting display panel includes a substrate, a plurality of top emission pixel structures and a plurality of bottom emission pixel structures. The top emission pixel structures are disposed on the substrate, and the bottom emission pixel structures are disposed on the substrate. The top emission pixel structures and the bottom emission pixel structures are arranged alternatively on the substrate.

7 Claims, 9 Drawing Sheets

(56) References Cited

U.S. PATENT DOCUMENTS

| | | | |
|---|---|---|---|
| 7,919,920 B2 | 4/2011 | Kwak | |
| 2004/0070711 A1* | 4/2004 | Wen et al. | 349/114 |
| 2004/0075628 A1 | 4/2004 | Chien et al. | |
| 2004/0080687 A1* | 4/2004 | Chuang | 349/113 |
| 2004/0227159 A1* | 11/2004 | Nakashima et al. | 257/202 |
| 2004/0239658 A1* | 12/2004 | Koyama et al. | 345/204 |
| 2004/0245531 A1* | 12/2004 | Fuii et al. | 257/88 |
| 2004/0263056 A1* | 12/2004 | Seo et al. | 313/500 |
| 2004/0263425 A1* | 12/2004 | Anzai et al. | 345/1.1 |
| 2005/0127820 A1* | 6/2005 | Yamazaki et al. | 313/501 |
| 2005/0151830 A1* | 7/2005 | Yamazaki | 347/238 |
| 2005/0225705 A1* | 10/2005 | Chae et al. | 349/114 |
| 2006/0007372 A1* | 1/2006 | Yuuki et al. | 349/96 |
| 2006/0066229 A1* | 3/2006 | Nimura | 313/506 |
| 2006/0139268 A1* | 6/2006 | Kobayashi | 345/87 |
| 2006/0189097 A1* | 8/2006 | Maruyama et al. | 438/458 |
| 2007/0210701 A1 | 9/2007 | Hung et al. | |
| 2008/0012478 A1 | 1/2008 | Hung et al. | |
| 2008/0303982 A1 | 12/2008 | Jin et al. | |
| 2009/0134776 A1* | 5/2009 | Ono et al. | 313/503 |
| 2009/0269485 A1* | 10/2009 | Ikeda et al. | 427/66 |
| 2011/0148944 A1* | 6/2011 | Kobayashi | 345/690 |
| 2012/0032175 A1* | 2/2012 | Wang et al. | 257/59 |

FOREIGN PATENT DOCUMENTS

| | | |
|---|---|---|
| TW | 200405064 | 4/2004 |
| TW | I230283 | 4/2005 |
| TW | 200630915 | 9/2006 |
| TW | 200723937 | 6/2007 |
| TW | 200730018 | 8/2007 |
| TW | 200806074 | 1/2008 |
| TW | 201133822 | 10/2011 |
| TW | 201142778 | 12/2011 |
| TW | 201145505 | 12/2011 |

OTHER PUBLICATIONS

Chih-Hao Chang, et al., "Efficient phosphorescent white OLEDs with high color rendering capability", Organic Electronics, vol. 11, 2010, pp. 412-418.

Chih-Hao Chang, et al., "Highly efficient phosphorescent blue and white organic light-emitting devices with simplified architectures", Thin Solid Films, vol. 519, 2011, pp. 7992-7997.

H. Fukagawa, et al., "Highly efficient, deep-blue phosphorescent organic light emitting diodes with a double emitting layer structure", Applied Physics Letters, vol. 93, 2008, pp. 133312-1-133312-3.

Chung-Chih Wu, et al., "Advanced Organic Light-Emitting Devices for Enhancing Display Performances", Journal of Display Technology, vol. 1, No. 2, Dec. 2005, pp. 248-266.

Sun Young Kim, et al., "Low voltage efficient simple p-i-n type electrophosphorescent green organic light-emitting devices", Applied Physics Letters, vol. 94, 2009, pp. 133303-1-133303-3.

"Office Action of Taiwan Counterpart Application", issued on Aug. 25, 2014, p. 1-p. 10.

"Office Action of China Counterpart Application," issued on Feb. 28, 2015, p. 1-p. 8, in which the listed references were cited.

* cited by examiner

DOUBLE-SIDE LIGHT EMITTING DISPLAY PANEL

CROSS-REFERENCE TO RELATED APPLICATION

This application claims the priority benefit of Taiwan application serial no. 101102899, filed on Jan. 30, 2012. The entirety of the above-mentioned patent application is hereby incorporated by reference herein and made a part of this specification.

TECHNICAL FIELD

The present disclosure relates to a double-side light emitting display panel.

BACKGROUND

Because display panel serves as a communication interface between humans and information, its development is particularly important. Among the display panels, organic electroluminescent display (OLED) has the greatest potential to become the major display product in the next generation, with the advantages including self-illuminating screen, wide viewing angle, low power consumption, simple manufacturing process, low cost, a wide operating temperature range, a high response speed and full-color display.

In addition, large-sized display billboard or display panel over 50 inch size may be mostly suspended in high space so that the viewer can view by just raising head. Therefore, if the display panel has double-side light emitting function, it will provide more information for the viewer coming or going. The current problems for double-side light emitting display panel are increasing weight and thickness and significantly raising cost.

SUMMARY

The present disclosure provides a double-side light emitting display panel, which includes a substrate, a plurality of bottom emission pixel structures and a plurality of top emission pixel structures. The bottom emission pixel structures are disposed on the substrate. The top emission pixel structures are disposed on the substrate, wherein the top emission pixel structures and the bottom emission pixel structures are arranged alternatively on the substrate.

In order to make the aforementioned and other features and advantages of the application more comprehensible, embodiments accompanying Figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DETAILED DESCRIPTION OF DISCLOSED EMBODIMENTS

Figure 1A:
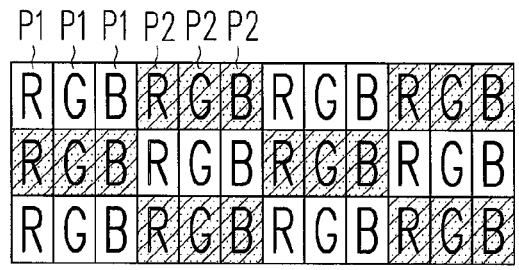
FIG. 1A-1D are schematic views of a double-side light emitting display panel according to several embodiments of the present disclosure.
Figure 1B:
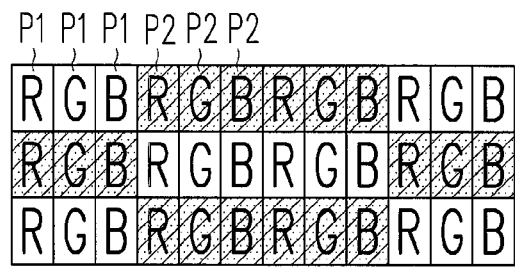
Figure 1C:
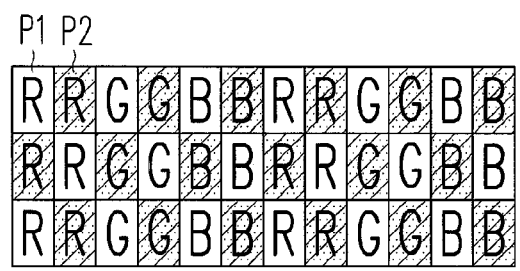
Figure 1D:
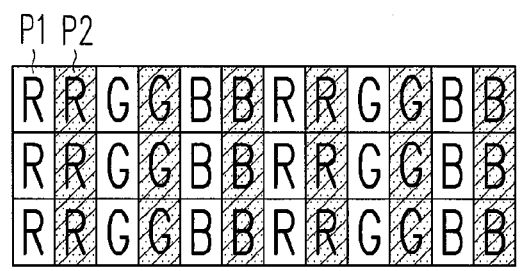

FIG. 1A is a schematic view of a double-side light emitting display panel according to an embodiment of the present disclosure. Referring to FIG. 1A, the double-side light emitting display panel of the present embodiment includes a plurality of bottom emission pixel structures P1 and a plurality of top emission pixel structures P2. The bottom emission pixel structures P1 and the top emission pixel structures P2 are arranged alternatively herein. According to the present embodiment, the bottom emission pixel structures P1 includes at least one red pixel structure R (P1), at least one green pixel structure G (P1) and at least one blue pixel structure B (P1). The top emission pixel structures P2 includes at least one red pixel structure R (P2), at least one green pixel structure G (P2) and at least one blue pixel structure B (P2). In the embodiment shown in FIG. 1A, the three bottom emission pixel structures P1 (R、G、B) and the three top emission pixel structures P2 (R、G、B) form a pixel unit respectively, and the pixel unit formed by the bottom emission pixel structures P1 and the pixel unit formed by the top emission pixel structures P2 are arranged alternatively so that the bottom emission pixel structures P1 and the top emission pixel structures P2 can be uniformly distributed in the double-side light emitting display panel.

It should be noted that the arrangement of the bottom emission pixel structures P1 and the emission pixel structures P2 of are not limited in the present disclosure. In other words, the arrangement of the bottom emission pixel structures P1 and the emission pixel structures P2 can also be the arrangements as shown in FIG. 1A, FIG. 1B, FIG. 1C or FIG. 1D, as along as the bottom emission pixel structures P1 and the top emission pixel structures P2 are uniformly distributed in the double-side light emitting display panel.

Here, the double-side light emitting display panel of the present disclosure can be an organic electro-luminescent display panel, a reflective display panel or other display panel which does not require a backlight source. If the double-side light emitting display panel is an organic electroluminescent display panel, the bottom emission pixel structures P1 are bottom emission organic electroluminescent pixel structures and the top emission pixel structures P2 are top emission organic electroluminescent pixel structures, which will be described in detail below.

Figure 2:
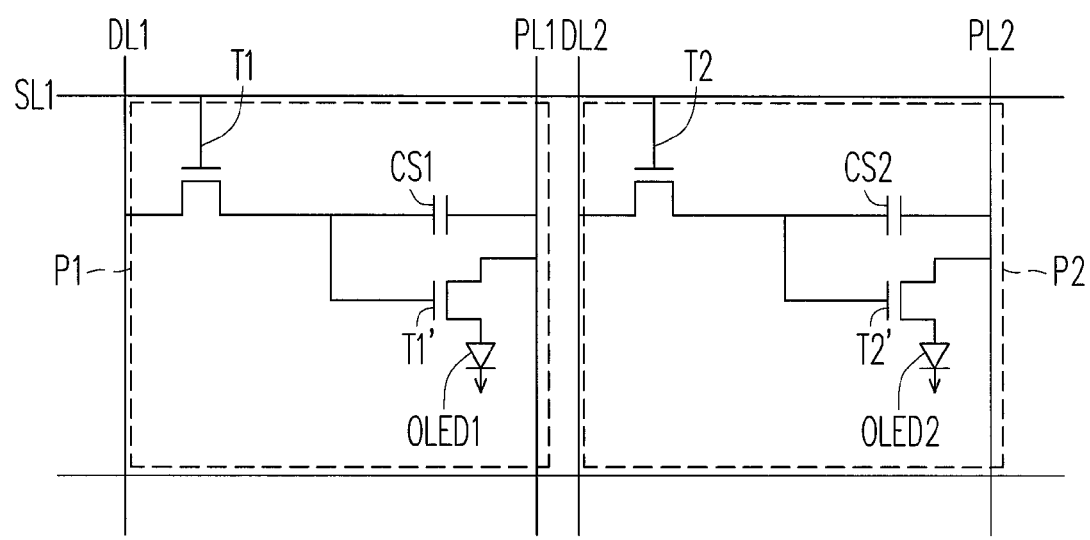
FIG. 2 is an equivalent circuit diagram illustrating one of the top emission pixel structures and one of the bottom emission pixel structures of a double-side light emitting display panel according to an embodiment of the present disclosure.
Figure 3:
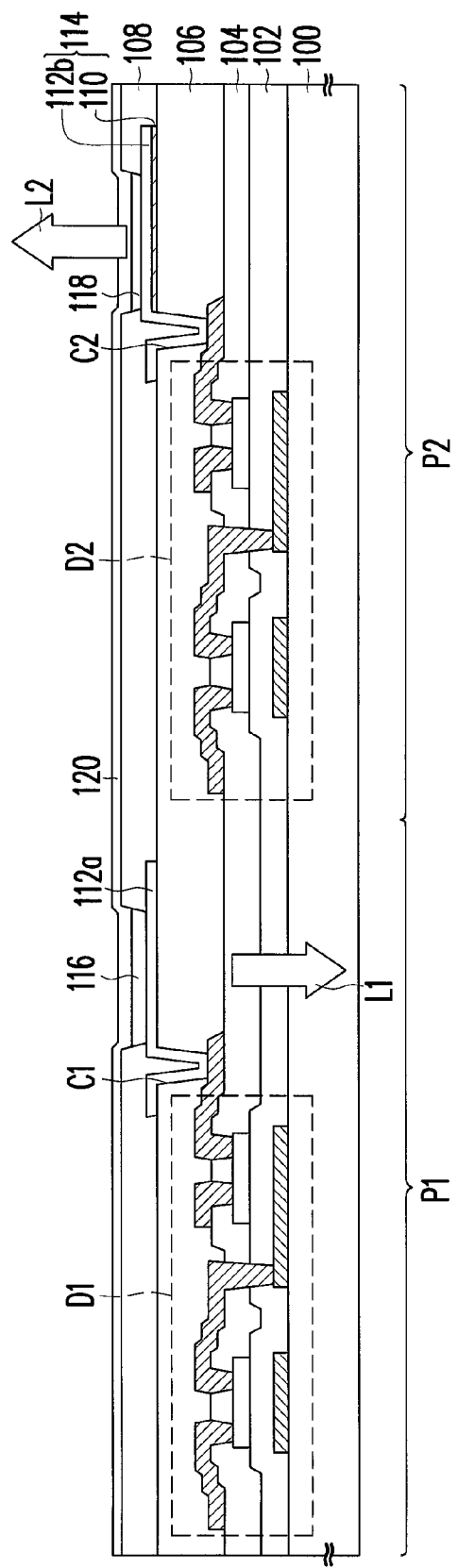
FIG. 3 to FIG. 6 are cross-section diagrams illustrating one of the top emission pixel structures and one of the bottom emission pixel structures of a double-side light emitting display panel according to several embodiments of the present disclosure.

FIG. 2 is an equivalent circuit diagram illustrating one of the top emission pixel structures and one of the bottom emission pixel structures of a double-side light emitting display panel according to an embodiment of the present disclosure. FIG. 3 is a cross-section diagram illustrating one of the top emission pixel structures and one of the bottom emission pixel structures of a double-side light emitting display panel according to an embodiment of the present disclosure.

Referring to FIG. 2 and FIG. 3, in the present embodiment, the bottom emission pixel structure P1 and the top emission pixel structure P2 are disposed above the substrate 100. The substrate 100 may be a transparent substrate, which can be a flexible substrate (such as plastic material) or a rigid substrate (such as glass). For simplicity, the two adjacent pixel structures are exemplified herein for the bottom emission pixel structure P1 and the top emission pixel structure P2, but the present disclosure is not only limited to this.

The bottom emission pixel structure P1 includes at least a control device D1, a transparent anode 112a, an organic light-emitting layer 116 and a transparent cathode 120.

According to the present embodiment, the control device D1 comprises control devices T1, T1' and a capacitor CS1. The control device T1 can be called a switch thin film transistor, which is electrically connected with a scan line SL1 and a data line DL1. The control device T1' can be called a driving thin film transistor, which is electrically connected with the control device T1 and a power line PL1. The capacitor CS1 is electrically connected with the control devices T1, T1' and the power line PL1. The structure with two control devices and one capacitor (2T1C) are exemplified herein for the top emission pixel structure P2, but the present disclosure is not limited to this. In other words, the number of the control device and the number of the capacitor in each bottom emission pixel structure P1 of the present disclosure are not limited. In addition, although a bottom gate thin film transistor is exemplified herein for the control device T1, T1', but the present disclosure is not limited to this. In other words, the control devices T1, T1' of the present embodiment can be top gate thin film transistors. In addition, an insulating layer 102 may mainly be the gate insulating layer of the control devices T1, T1', and an insulating layer 104 may mainly be the passivation layer of the control devices T1, T1'. In addition, a planar layer 106 is further formed to cover the insulating layer 104.

The transparent anode 112a is disposed above the planar layer 106 and electrically connected with the control device D1 (the control device T1') through a contact window C1. An isolating layer 108 is disposed above the planar layer 106 and exposes the transparent anode 112a. The organic light-emitting layer 116 is disposed on the exposed transparent anode 112a, which comprises a red organic light-emitting material, a blue organic light-emitting material or a green organic light-emitting material. The transparent cathode 120 is disposed on the organic light-emitting layer 116. The transparent anode 112a, the organic light-emitting layer 116 and the transparent cathode 120 form an organic light-emitting device OLED1 herein, and the organic light-emitting device OLED1 can emit red light, green light or blue light.

The top emission pixel structure P2 includes a control device D2, a reflective anode 114, an organic light-emitting layer 118 and the transparent cathode 120.

According to the present embodiment, the control device D2 comprises control devices T2, T2' and a capacitor CS2. The control device T2 can be called a switch thin film transistor, which is electrically connected with the scan line SL1 and a data line DL2. The control device T2' can be called a driving thin film transistor, which is electrically connected with the control device T2 and a power line PL2. The capacitor CS2 is electrically connected with the control devices T2, T2' and the power line PL2. The structure with two control devices and one capacitor (2T1C) are exemplified herein for the top emission pixel structures P2, but the present disclosure is not limited to this. In other words, the number of the control device and the number of the capacitor in each top emission pixel structure P2 of the present disclosure is not limited. In addition, although a bottom gate thin film transistor is exemplified herein for the actives device T2, T2', but the present disclosure is not limited to this. In other words, the control devices T2, T2' of the present embodiment can be top gate thin film transistors. Similarly, the insulating layer 102 may mainly be the gate insulating layer of the control devices T2, T2', and the insulating layer 104 may mainly be the passivation layer of the control devices T2, T2'.

The reflective anode 114 is disposed on the planar layer 106 and electrically connected with the control device D2 (the control device T2') through a contact window C2. The reflective anode 114 comprises an anode material 112b and a reflective layer 110, and the anode material 112b is electrically connected with the control device D2 (the control device T2'). According to the present embodiment, the anode material 112b of the top emission pixel structures P2 and the transparent anode 112a of the bottom emission pixel structures P1 are defined simultaneously. Therefore, the material and thickness of the anode material 112b and the transparent anode 112a are identical or similar. In addition, the reflective layer 110 is disposed below the anode material 112b, and the reflective layer 110 can contact the anode material 112b or do not contact the anode material 112b. The isolating layer 108 is disposed on the planar layer 106 and exposes the anode material 112b of the reflective anode 114. The organic light-emitting layer 118 is disposed above the exposed anode material 112b, which comprises a red organic light-emitting material, a blue organic light-emitting material or a green organic light-emitting material. The transparent cathode 120 is disposed on the organic light-emitting layer 118. The reflective anode 114, the organic light-emitting layer 118 and the transparent cathode 120 form an organic light-emitting device OLED2 herein, and the organic light-emitting device OLED2 can emit red light, green light or blue light.

The double-side light emitting display panel can further includes a protection layer covering the pixel structures P1 and P2, a cover plate disposed on the opposite side of the substrate 100, a sealant used to seal the pixel structures P1 and P2 and a dry material or any other component, etc.

Accordingly, since the anode 112a and the cathode 120 of the organic light-emitting device OLED1 of the bottom emission pixel structures P1 both are transparent, the light L1 emitted from the organic light-emitting layer 116 can emit downward through the substrate 100. Since the anode 114 of the organic light-emitting device OLED2 of the top emission pixel structure P2 is reflective and the cathode 120 of the organic light-emitting device OLED2 of the top emission pixel structure P2 is transparent, the light L2 emitted from the organic light-emitting layer 118 can emit upward after reflected by the reflective layer 110. Therefore, the viewer standing on the front of the double-side light emitting display panel can view the image displayed by the bottom emission pixel structures P1, and the viewer standing behind the double-side light emitting display panel can view the image displayed by the top emission pixel structures P2. In addition, since the bottom emission pixel structures P1 and the top emission pixel structures P2 are controlled by the corresponding driving device respectively, the double-side light emitting display panel can display different images on its front and back simultaneously. In addition, since the bottom emission pixel structures P1 and the top emission pixel structures P2 are fabricated on the same substrate 100, the weight and thickness of the double-side light emitting display panel of the present embodiment are equal to that of the conventional single-side light emitting display panel. Therefore, the problem of increment of the weight and thickness of the conventional double-side light emitting display panel can be prevent.

Figure 4:
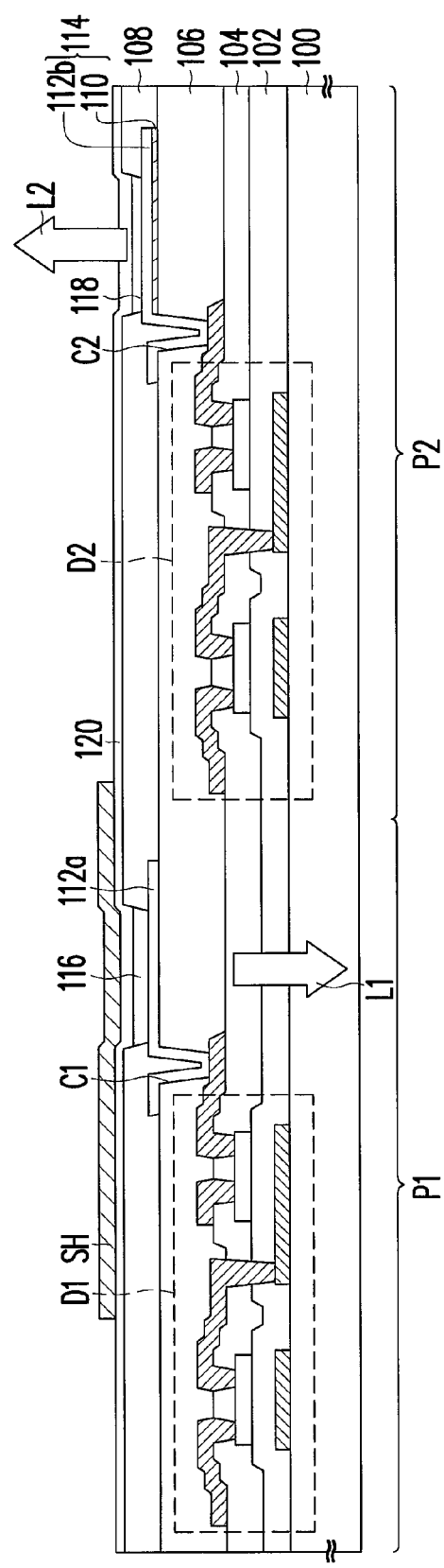

FIG. 4 is a cross-section diagram illustrating one of the top emission pixel structures and one of the bottom emission pixel structures of a double-side light emitting display panel according to an embodiment of the present disclosure. Since the embodiment shown in FIG. 4 is similar with the embodiment shown in FIG. 3, identical components will be denoted with the same numerals and not repeated. In the embodiment shown in FIG. 4, the bottom emission pixel structure P1 further comprises a shielding layer SH to cover the transparent cathode 120 of the bottom emission pixel structure P1. The shielding layer SH includes a reflective material layer, a light absorption material layer or a photoelectric conversion material layer. In other words, when the light generated by the organic light-emitting layer 116 reaches the shielding layer SH, the shielding layer SH can reflect the light, absorb the light or absorb the light and convert light energy into electrical energy. Since the anode 112a and the cathode 120 of the bottom emission pixel structure P1 both are transparent, the light generated by the organic light-emitting layer 116 not only can emit downward but also can emit upward. In the present embodiment, the shielding layer SH is further disposed above the transparent cathode 120 of the bottom emission pixel structure P1 to force the light L1 generated by the organic light-emitting layer 116 to emit downward through the substrate 100. Accordingly, the interference to the top emission pixel structures P2 can be lower to improve the image display quality of the top emission pixel structures P2.

Figure 5:
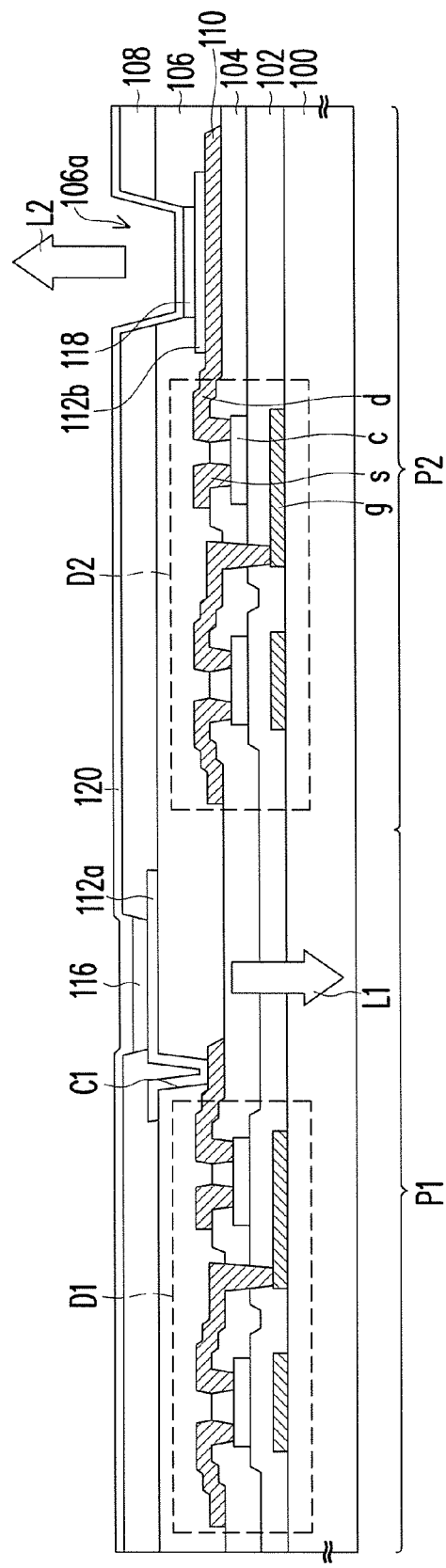

FIG. 5 is a cross-section diagram illustrating one of the top emission pixel structures and one of the bottom emission pixel structures of a double-side light emitting display panel according to an embodiment of the present disclosure. Since the embodiment shown in FIG. 5 is similar with the embodiment shown in FIG. 3, identical components will be denoted with the same numerals and not repeated. In the embodiment shown in FIG. 5, the reflective layer 110 of the top emission pixel structure P2 is not disposed above the planar layer 106. In the present embodiment, the reflective layer 110 and the drain d and the source s of the control device D2 (the control device T2') of the top emission pixel structure P2 are formed in the same layer. In details, the control device T2' has a gate g, the source s, the drain d and a channel ch, and the reflective layer 110 is extended from the drain d. In addition, the planar layer 106 has an opening 106a to expose the reflective layer 110 of the top emission pixel structures P2, and the anode material 112b of the reflective anode 114 and the organic light-emitting layer 118 are located in the opening 106a. Since the reflective layer 110 is extended from the drain d herein (i.e., the reflective layer 110 and the drain d and the source s are defined simultaneously), the process of the double-side light emitting display panel of the present embodiment can further save a photo mask.

Figure 6:
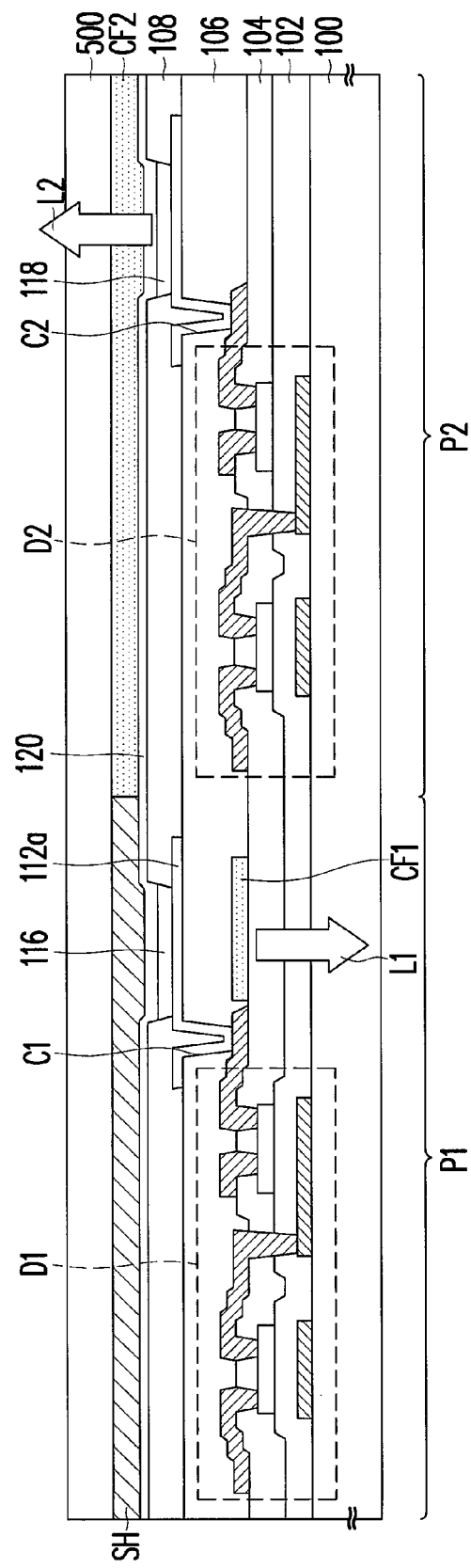

FIG. 6 is a cross-section diagram illustrating one of the top emission pixel structures and one of the bottom emission pixel structures of a double-side light emitting display panel according to an embodiment of the present disclosure. Since the embodiment shown in FIG. 6 is similar with the embodiment shown in FIG. 3, identical components will be denoted with the same numerals and not repeated. In the embodiment as shown in FIG. 6, except for the control device D1, the transparent anode 112a, the organic light-emitting layer 116 and the transparent cathode 120, the bottom emission pixel structure P1 further includes a color filter layer CF1. The organic light-emitting layer 116 which is disposed above the transparent anode 112a includes a white organic light-emitting material herein. Accordingly, the organic light-emitting layer 116 emits white light. In addition, the color filter layer CF1 is disposed below the transparent anode 112a. In the present embodiment, the color filter layer CF1 is disposed between the insulating layer 104 and the planar layer 106, but the present disclosure is not limited to this. Besides, the color filter layer CF1 includes a green filter layer, a blue filter layer, or a red filter layer. Therefore, after passing through the color filter layer CF1, the white light emitted from the organic light-emitting layer 116 may become the light L1 which may be red light, green light or blue light.

In addition, except for the control device D2, the reflective anode 114, the organic light-emitting layer 118 and the transparent cathode 120, the top emission pixel structure P2 further includes a color filter layer CF2. In the present embodiment, since the organic light-emitting layer 118 which is disposed on the reflective anode 114 includes a white organic light-emitting material, the organic light-emitting layer 118 emits white light. In addition, the color filter layer CF2 includes a red filter layer, a green filter layer, or a blue filter layer. Therefore, after reflected by the reflective layer 110 and passing through the color filter layer CF2, the white light emitted from the organic light-emitting layer 118 may become the light L2 which may be red light, green light or blue light.

In addition, in the present embodiment, the bottom emission pixel structure P1 can further include the shielding layer SH. The shielding layer SH covers the transparent cathode 120. The shielding layer SH comprises a reflective material layer, a light absorption material layer or a photoelectric conversion material layer. In other words, when the light generated by the organic light-emitting layer 116 reaches the shielding layer SH, the shielding layer can reflect the light, absorb the light or absorb the light and convert light energy into electrical energy. Since the anode 112a of the bottom emission pixel structures P1 and the cathode 120 both are transparent, the light generated by the organic light-emitting layer 116 not only can emit downward but also can emit upward. Therefore, if the shielding layer SH is further disposed above the transparent cathode 120 of the bottom emission pixel structures P1, the light L1 generated by the organic light-emitting layer 116 will be forced to emit downward through the substrate 100. Accordingly, the interference to the top emission pixel structures P2 can be lower so as to improve the image display quality of the top emission pixel structures P2. In addition, the display panel of the present embodiment can further include a cover plate 500 which covers the shielding layer SH and the color filter layer CF2. The material of the cover plate 500 can be identical or similar with the substrate 100.

In the embodiments as shown in FIG. 3 to FIG. 6, the double-side light emitting display panel is an organic electroluminescent display. Therefore, the bottom emission pixel structure P1 is a bottom emission organic electroluminescent structure, and the top emission pixel structure P2 is a top emission organic electroluminescent structure. According to another embodiment, if the double-side light emitting display panel is a reflective display panel, the bottom emission pixel structure P1 is a bottom emission reflective structure and the top emission pixel structure P2 is a top emission reflective structure, which will be described in detail below.

Figure 7:
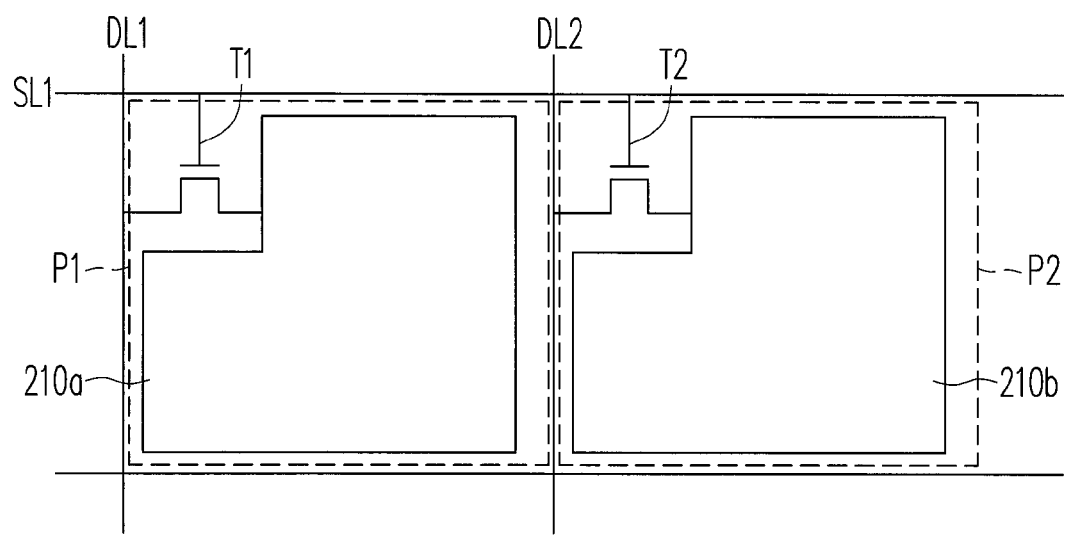
FIG. 7 is an equivalent circuit diagram illustrating one of the top emission pixel structures and one of the bottom emission pixel structures of a double-side light emitting display panel according to an embodiment of the present disclosure.
Figure 8:
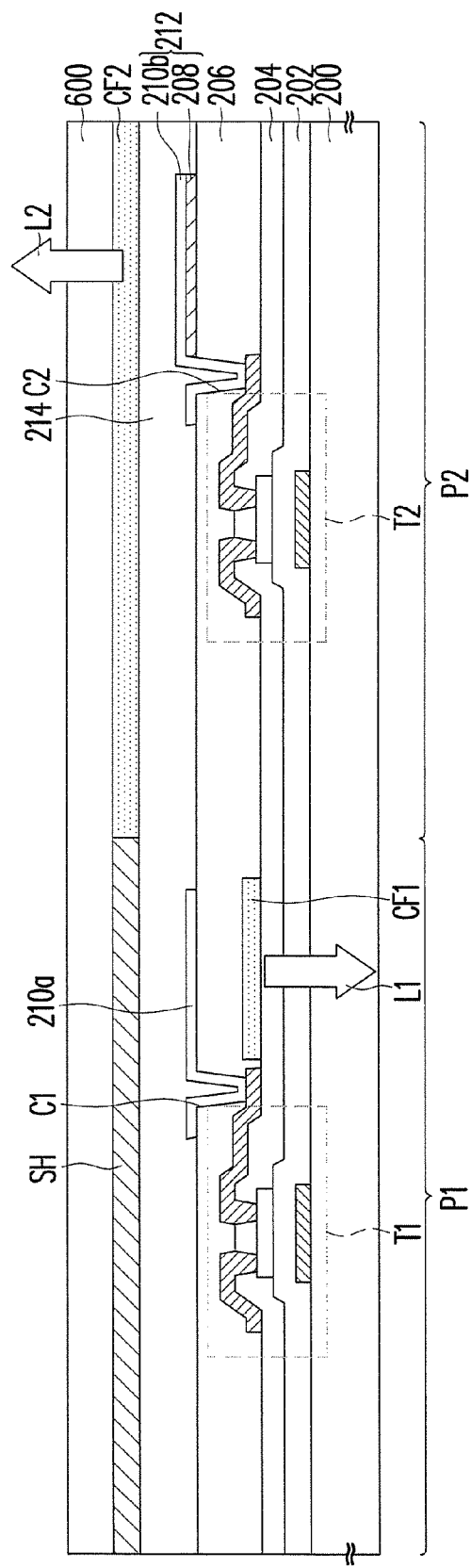
FIG. 8 and FIG. 9 are cross-section diagrams illustrating one of the top emission pixel structures and one of the bottom emission pixel structures of a double-side light emitting display panel according to several embodiments of the present disclosure.

FIG. 7 is a cross-section diagram illustrating one of the bottom emission pixel structures and one of the top emission pixel structures of a double-side light emitting display panel according to an embodiment of the present disclosure. FIG. 8 is a cross-section diagram illustrating one of the bottom emission pixel structures and one of the top emission pixel structures of a double-side light emitting display panel according to an embodiment of the present disclosure. Referring to FIG. 7 and FIG. 8, in the present embodiment, the bottom emission pixel structure P1 and the top emission pixel structure P2 are disposed above the substrate 200. The substrate 200 is a transparent substrate, which can be a flexible substrate (such as plastic material) or a rigid substrate (such as glass). Similarly, the arrangement of the bottom emission pixel structure P1 and the top emission pixel structure P2 can be the arrangements as shown in FIG. 1A, FIG. 1B, FIG. 1C or FIG. 1D.

For simplicity, the two adjacent pixel structures are exemplified herein for the bottom emission pixel structure P1 and the top emission pixel structure P2.

The bottom emission pixel structure P1 comprises the control device T1, a transparent electrode 210a, the color filter layer CF1 and a reflective display medium 214.

According to the present embodiment, the control device T1 is electrically connected with the scan line SL1 and the data line DL1. Although a bottom gate thin film transistor is exemplified herein for the control device T1, but the present disclosure is not limited to this. In other words, the control device T1 in this embodiment can be a top gate thin film transistor. In addition, an insulating layer 202 may mainly be the gate insulating layer of the control device T1, and an insulating layer 204 may mainly be passivation layer of the control device T1. In addition, a planar layer 206 is further disposed to cover the insulating layer 204.

The transparent electrode 210a is disposed on the planar layer 206 and electrically connected with the control device T1 through the contact window C1. The color filter layer CF1 is disposed below the transparent electrode 210a. In the present embodiment, the color filter layer CF1 is disposed between the insulating layer 204 and the planar layer 206, but the present disclosure is not limited to this. In addition, the color filter layer CF1 includes a red filter layer, a green filter layer, or a blue filter layer. The reflective display medium 214 is disposed above the transparent electrode 210a. The reflective display medium 214 comprises an electrowetting display medium, an electrophoretic display medium or other reflective display medium. In addition, the double-side light emitting display panel of the present embodiment may further includes a cover plate 600 which is disposed opposite to the substrate 100. The material of the cover plate 600 can be identical or similar with the substrate 100.

As described above, after the external light source enters the reflective display medium 214 through the cover plate 600, a part of the light may be reflected by the reflective display medium 214 and emits through the cover plate 600 again, and another part of the light may pass through the reflective display medium 214 and color filter layer CF1 to form the light L1, wherein the light L1 may be red light, green light or blue light.

The top emission pixel structure P2 comprises the control device T2, a reflective electrode 212, the color filter layer CF2 and the reflective display medium 214.

The control device T2 is electrically connected with the scan line SL1 and the data line DL2. Although a bottom gate thin film transistor is exemplified herein for the control device T2, but the present disclosure is not limited to this. In other words, the control device T2 of the present embodiment can be a top gate thin film transistor. In addition, the insulating layer 202 may mainly be the gate insulating layer of the control device T2, and the insulating layer 204 may mainly be the passivation layer of the control device T2.

The reflective electrode 212 is disposed above the planar layer 206 and electrically connected with the control device T2 through the contact window C2. The reflective electrode 212 comprises an electrode material 210b and a reflective layer 208, and the electrode material 210b is electrically connected with control device T2. According to the present embodiment, the electrode material 210b of the top emission pixel structure P2 and the transparent electrode 210a of the bottom emission pixel structure P1 are defined simultaneously. Therefore, the material and the thickness of the electrode material 210b and the transparent electrode 210a are identical or similar. In addition, the reflective layer 208 is disposed below the electrode material 210b, and the reflective layer 208 can contact the electrode material 210b or do not contact the electrode material 210b. The reflective display medium 214 is disposed above the reflective electrode 212. The reflective display medium 214 comprises an electrowetting display medium, an electrophoretic display medium or other reflective display medium. The color filter layer CF2 is disposed on the reflective display medium 214, and the color filter layer CF2 includes a red filter layer, a green filter layer, or a blue filter layer.

As described above, after the external light enters the reflective display medium 214 through the cover plate 600 and the color filter layer CF2, the light may be reflected by the reflective display medium 214 and/or the reflective layer 208, and the reflected light passes through the color filter layer CF2 again to form the light L2 and emits through the cover plate 600, wherein the light L2 may be red light, green light or blue light.

In other words, the light L1 emitted by the bottom emission pixel structure P1 can emit downward through the substrate 100, and the light L2 emitted by the top emission pixel structure P2 may emit through the cover plate 600. Therefore, the viewer standing on the front of the double-side light emitting display panel can view the image displayed by the bottom emission pixel structures P1, and the viewer standing behind the double-side light emitting display panel can view the image displayed by the top emission pixel structures P2. In addition, since the bottom emission pixel structures P1 and the top emission pixel structures P2 are controlled by the corresponding driving device respectively, the double-side light emitting display panel can display different images on its front and back simultaneously. Since the bottom emission pixel structures P1 and the top emission pixel structures P2 are fabricated on the same substrate 200, the weight and thickness of the double-side light emitting display panel of the present embodiment are equal to that of the conventional single-side light emitting display panel, the problem of increment of the weight and thickness of the conventional double-side light emitting display panel can be prevent.

It should be noted that the bottom emission pixel structures P1 of the present embodiment can further include the shielding layer SH. The shielding layer SH covers the reflective display medium 214, and the cover plate 600 covers the shielding layer SH. The shielding layer SH includes a reflective material layer, a light absorption material layer or a photoelectric conversion material layer. In other words, when the light reflected by the reflective display medium 214 reaches the shielding layer SH, the shielding layer SH can reflect the light, absorb the light or absorb the light and convert light energy into electrical energy. The shielding layer SH disposed above the transparent cathode 120 of the bottom emission pixel structure P1 can force the light L1 of the bottom emission pixel structure P1 to emit downward through the substrate 100. Accordingly, the interference to the top emission pixel structures P2 can be lower so as to improve the image display quality of the top emission pixel structures P2.

Figure 9:
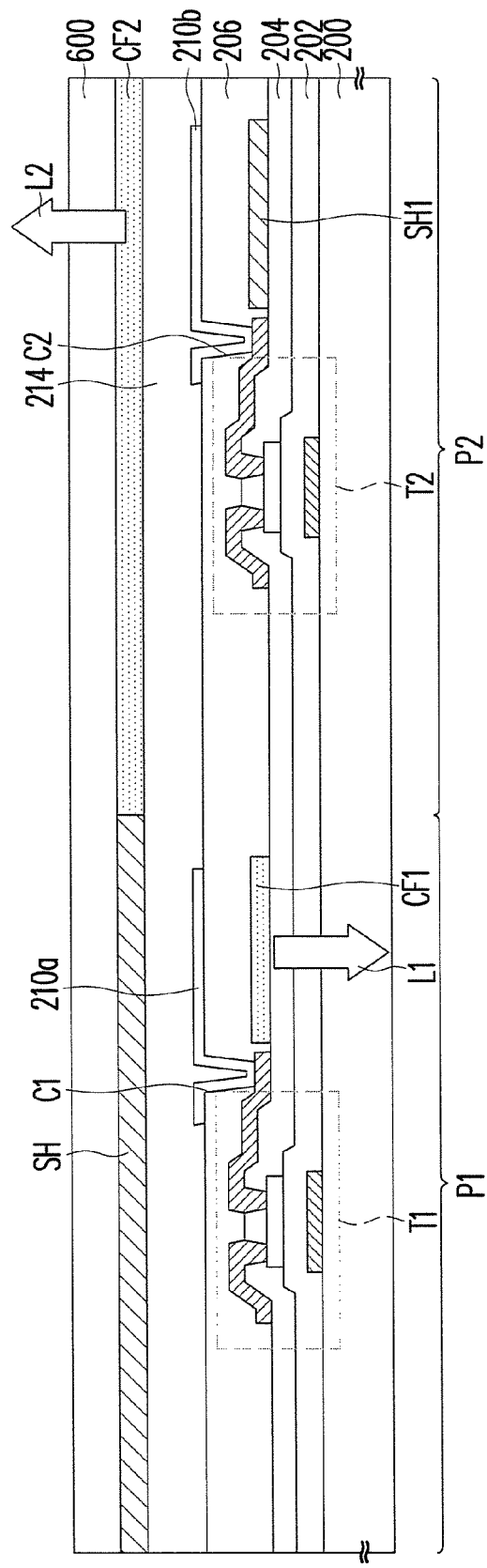

FIG. 9 is a cross-section diagram illustrating one of the top emission pixel structures and one of the bottom emission pixel structures of a double-side light emitting display panel according to an embodiment of the present disclosure. Since the embodiment shown in FIG. 9 is similar with the embodiment shown in FIG. 8, identical components will be denoted with the same numerals and not repeated. In the embodiment as shown in FIG. 9, the structure of the bottom emission pixel structure P1 is the same as that described in FIG. 8, and the top emission pixel structure P2 comprises the control device T2, the electrode material 210b, a shielding layer SH1, the reflective display medium 214 and the color filter layer CF2. Here, the control device T2, the electrode material 210b, the reflective display medium 214 and the color filter layer CF2 are the same or similar to that described in FIG. 8. In the present embodiment, the electrode material 210b is a transparent electrode material. Therefore, the shielding layer SH1 may be further disposed below the electrode material 210b. The shielding layer SH1 includes a reflective material layer, a light absorption material layer or a photoelectric conversion material layer. In other words, when the light passing through the reflective display medium 214 reaches the shielding layer SH1, the shielding layer SH1 can reflect the light, absorb the light or absorb the light and convert light energy into electrical energy. Therefore, the light L2 of the top emission pixel structure P2 may be forced to emit toward the cover plate 600.

In summary, the double-side light emitting display panel of the present disclosure can be an organic electroluminescent display panel, a reflective display panel or other display panel which does not require a backlight source. Since the top emission pixel structures and the bottom emission pixel structures are arranged alternatively on the same substrate, compare to the conventional double-side light emitting display panel, the weight and thickness does not increase. In addition, since the top emission pixel structures and the bottom emission pixel structures are controlled by the corresponding driving device respectively, the double-side light emitting display panel can display different images on its front and back simultaneously.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A double-side light emitting display panel, comprising:
    a substrate;
    a plurality of bottom emission pixel structures, disposed on the substrate, each of the bottom emission pixel structures is a bottom emission organic electroluminescent pixel structure, wherein the bottom emission organic electroluminescent pixel structure comprises:
        a control device;
        a transparent anode, electrically connected to the control device;
        an organic light-emitting layer, disposed on the transparent anode, and the organic light-emitting layer comprises a red organic electroluminescent material, a blue organic electroluminescent material or a green organic electroluminescent material;
        a transparent cathode, disposed on the organic light-emitting layer; and
        a shielding layer covering only part of the transparent cathode, wherein the shielding layer comprises a photoelectric conversion material layer; and
    a plurality of top emission pixel structures, disposed on the substrate, each of the top emission pixel structures is a top emission organic electroluminescent pixel structure,
    wherein the top emission pixel structures and the bottom emission pixel structures are arranged alternatively on the substrate.

2. The double-side light emitting display panel as claimed in claim 1, wherein the bottom emission pixel structures comprise a red pixel structure, a green pixel structure and a blue pixel structure, and the top emission pixel structures comprise a red pixel structure, a green pixel structure and a blue pixel structure.

3. The double-side light emitting display panel as claimed in claim 1, wherein the top emission organic electroluminescent pixel structure comprises:
    a control device;
    a reflective anode, electrically connected to the control device;
    an organic light-emitting layer, disposed on the reflective anode, and the organic light-emitting layer comprises a red organic light-emitting material, a blue organic light-emitting material or a green organic light-emitting material;
    a transparent cathode disposed on the organic light-emitting layer.

4. The double-side light emitting display panel as claimed in claim 3, wherein the reflective anode comprises an anode material and a reflective layer.

5. A double-side light emitting display panel, comprising:
    a substrate;
    a plurality of bottom emission pixel structures, disposed on the substrate, each of the bottom emission pixel structures is a bottom emission reflective pixel structure, wherein the bottom emission reflective pixel structure comprises:
        a control device;
        a transparent electrode, electrically connected to the control device;
        a color filter layer, disposed below the transparent electrode;
        a reflective display medium, disposed on the transparent electrode; and
        a shielding layer covering the reflective display medium; and
    a plurality of top emission pixel structures, disposed on the substrate, each of the top emission pixel structures is a top emission reflective pixel structure, wherein the top emission pixel structure comprises:
        a control device;
        a reflective electrode, electrically connected to the control device;
        a reflective display medium, disposed on the reflective electrode; and
        a color filter layer, disposed directly on the reflective display medium;
    wherein the top emission pixel structures and the bottom emission pixel structures are arranged alternatively on the substrate.

6. The double-side light emitting display panel as claimed in claim 5, wherein the shielding layer comprises a reflective material layer, a light absorption layer or a photoelectric conversion material layer.

7. A double-side light emitting display panel, comprising:
    a substrate;
    a plurality of bottom emission pixel structures, disposed on the substrate, each of the bottom emission pixel structures is a bottom emission reflective pixel structure, wherein the bottom emission reflective pixel structure comprises:
        a control device;

a transparent electrode, electrically connected to the control device;

a color filter layer, disposed below the transparent electrode;

a reflective display medium, disposed on the transparent electrode; and a shielding layer covering the reflective display medium; and a plurality of top emission pixel structures, disposed on the substrate, each of the top emission pixel structures is a top emission reflective pixel structure, wherein the top emission reflective pixel structure comprises:

a control device;

an electrode material, electrically connected to the control device;

a shielding layer, disposed directly below the electrode material;

a reflective display medium, disposed above the electrode material; and a color filter layer, disposed directly on the reflective display medium;

wherein the top emission pixel structures and the bottom emission pixel structures are arranged alternatively on the substrate.

\* \* \* \* \*